United States Patent [19]

Caratsch

[11] Patent Number: 4,469,716

[45] Date of Patent: Sep. 4, 1984

[54] PROCESS FOR THE APPLICATION OF SOLDER ON PRINTED CIRCUIT BOARDS AND PROCESS FOR THEIR PLACEMENT IN AND REMOVAL FROM THIS DEVICE

[75] Inventor: Hans P. Caratsch, Bremgarten, Switzerland

[73] Assignee: Sinter Limited, Bristol, England

[21] Appl. No.: 431,093

[22] Filed: Sep. 30, 1982

Related U.S. Application Data

[62] Division of Ser. No. 300,971, Sep. 9, 1981, Pat. No. 4,414,914.

[30] Foreign Application Priority Data

Sep. 9, 1980 [CH] Switzerland .................. 6760/80

[51] Int. Cl.³ .............................................. H05K 3/22
[52] U.S. Cl. ..................................... 427/96; 427/349; 427/433; 228/180 R
[58] Field of Search ................ 427/433, 432, 349, 96; 118/428, 425, 63, 423; 228/47, 180 R, 259, 20, 40

[56] References Cited

U.S. PATENT DOCUMENTS

| 1,572,953 | 2/1926 | Pletsch ................................ 118/425 |
| 2,803,216 | 10/1957 | Termini et al. ...................... 118/423 |
| 3,416,958 | 12/1968 | Oxford ................................ 427/433 |
| 3,924,794 | 12/1975 | Allen et al. ...................... 427/349 X |

FOREIGN PATENT DOCUMENTS

| 994611 | 4/1976 | Canada . |
| 1002815 | 7/1977 | Canada . |
| 2411854 | 8/1975 | Fed. Rep. of Germany . |
| 1207667 | 7/1970 | United Kingdom . |
| 1269085 | 6/1972 | United Kingdom . |
| 1457325 | 3/1976 | United Kingdom . |
| 1446636 | 4/1976 | United Kingdom . |

*Primary Examiner*—John D. Smith
*Assistant Examiner*—Bernard F. Plantz
*Attorney, Agent, or Firm*—Wenderoth, Lind & Ponack

[57] ABSTRACT

Clamp-like guides are arranged in the interior of a soldering bath container at a distance from each other and distributed across the width of the soldering bath container. Each guide has two guide rods which are spaced from each other by a certain distance and which are connected with each other at their lower ends. The upper final sections of the guide rods project upward from a soldering bath and have deflections at their upper ends which form a narrowing therebetween. The final sections can be elastically deflectable and are supported by support springs. Above the guides, two blast nozzles extend across the width of the soldering bath container and direct hot air jets against the surfaces of printed circuit boards leaving the soldering bath. The width of the narrowing is somewhat larger than the thickness of the printed circuit boards. Several guiding points are formed across the width of the printed circuit board by the guides without necessitating a constant mechanical contact between the printed circuit board and the guide rods. Since the upper final sections of the guide rods can elastically yield when the printed circuit board abuts against the deflections, damage to the printed circuit board is avoided.

5 Claims, 2 Drawing Figures

PROCESS FOR THE APPLICATION OF SOLDER ON PRINTED CIRCUIT BOARDS AND PROCESS FOR THEIR PLACEMENT IN AND REMOVAL FROM THIS DEVICE

This is a division of application Ser. No. 300,971, filed Sept. 9, 1981 now U.S. Pat. No. 4,414,914.

BACKGROUND OF THE INVENTION

The present invention relates to a process for the application of solder on printed circuit boards.

In the case of a known process of this type, a guiding system consists of two vertical guiding rails each of which has a U-shaped guiding channel (German Disclosure Publication 24 11 854). The printed circuit boards are guided in these guiding channels and also are held on two narrow sides located opposite each other. The guiding rails extend from the soldering bath upward past blast nozzles from which emerge hot air jets which are directed against the surfaces of the printed circuit boards pulled out of the soldering bath. By means of these air jets, excessive solder is removed from the printed circuit board which passes by and, additionally, the solder is removed from passage holes in the printed circuit boards. In order to be able to properly hold and guide the printed circuit boards, particularly when they are exposed to the hot air jets, the width of the guiding channels is selected in such a manner that it corresponds approximately with the thickness of the printed circuit boards.

This requires a very exacting and, therefore, complex positioning of the printed circuit boards for their introduction into the guiding channels. Furthermore, printed circuit boards which are slightly curved can only be introduced with difficulty or not at all. Furthermore, an adjustment or exchange of the guiding rails becomes necessary for the processing of printed circuit boards of different widths or thicknesses. Since the printed circuit boards are softened in the hot solder bath, there is additionally the danger of damaging the printed circuit boards, which are not yet resistant to mechanical wear when leaving the soldering bath, owing to the heavy lateral guide.

SUMMARY OF THE INVENTION

It is the purpose of the present invention to avoid the aforementioned disadvantages and thus to provide a process of the type mentioned above with which printed circuit boards of different widths and thicknesses and also printed circuit boards which are not exactly plane can be introduced into a solding bath without the necessity of very exact positioning and thus with a high operating speed, whereby the printed circuit boards nevertheless are properly guided and held during their movement and are not exposed to the danger of being damaged.

This task is accomplished according to the invention by the provision that the printed circuit boards are not guided along two edges by two rows of guiding elements, but rather are guided across their entire width on both sides. Proper guiding is guaranteed by the thus resulting multitude of guiding points without necessitating a constant mechanical contact between the printed circuit boards and the guiding elements. Moreover, the necessity of a very exact positioning of the printed circuit boards, as is required for the introduction into guiding rails, is eliminated. Even slightly curved printed circuit boards can be introduced and guided without any difficulty. The danger of damaging the printed circuit boards is thus largely avoided. Furthermore, the necessity of adjusting the guiding elements to different board widths or thicknesses is eliminated.

According to the invention, the placement of printed circuit boards in or for their removal from the device is characterized by the fact that the respective, vertically aligned printed circuit board is necessarily centered vertically with respect to its plane relative to the guiding system in the soldering bath container during the placement or removal process. In this manner, a quick and exact placement or removal, of each printed circuit board into or from the device is guaranteed without requiring a complex manipulation.

The centering of the printed circuit boards is appropriately effected by means of guiding elements which are preferably arranged between the opening in the casing cover and the blast nozzles.

It is particularly essential for the process according to the invention that the printed circuit board is guided and/or positioned without constant mechanical contact. In this fashion, on the one hand, exact guiding and positioning of the respective printed circuit boards is guaranteed in the soldering bath and, on the other hand, the danger of damaging the printed circuit plates which are especially sensitive after coating is avoided.

Advantageously, the guiding and/or positioning of the printed circuit board is effected without constant mechanical contact by means of a guiding system which has several guiding elements running essentially vertically and which are arranged in two rows opposite each other and in rows at a distance from each other distributed across the entire width of the printed circuit boards introduced into the soldering bath.

The process according to the invention solves the especially critical phase of the removal of the respective printed circuit board from the soldering bath container in a technically advantageous manner. This phase is a critical one for two reasons. First of all, the carrier material of the printed circuit plates is softened owing to the relatively high temperature of the soldering bath so that the printed circuit plates are particularly sensitive to being damaged when pulled out of the device, for example, by being bent or such. Secondly, the hot air jets, acting on both wide sides of the printed circuit board when it is pulled out, can cause vibrations of the printed circuit board by means of which the printed circuit board can abut against components of the device and damage to the printed circuit board can thus be caused. The respective printed circuit board can be subjected to vibrations by the hot air jets because the blast nozzles are arranged staggered with respect to each other in the vertical direction on opposite sides of the transport path of the printed circuit boards. This staggering is necessary since, if the blast nozzles were arranged directly opposite each other, they would essentially neutralize each other when blowing through the passage holes in the respective printed circuit board and, thus, the excessive solder would not be sufficiently removed from the passage holes in the printed circuit boards.

The process according to the invention makes sure that, with the removal of the respective printed circuit plate, the latter is stabilized relative to the air jets acting upon the two wide sides of the printed circuit board in a vertically staggered fashion. This stabilization is achieved by means of a number of elements which are arranged in two rows opposite each other and in rows at a distance from each other distributed across the entire width of the printed circuit board introduced into the soldering bath and which extend from below as far as possible into the space between the two blast nozzles. In this context, it is particularly expedient that the elements are designed vertically in an elastic way relative to the respective wide sides of the printed circuit board.

In the preferred embodiment of the invention, these elements are formed by the upper final sections of the guiding elements.

BRIEF DESCRIPTION OF THE DRAWINGS

An exemplified embodiment of the present invention will be explained below in greater detail with reference to the accompanying drawings, wherein schematically.

DETAILED DESCRIPTION OF THE INVENTION

Figure 1:
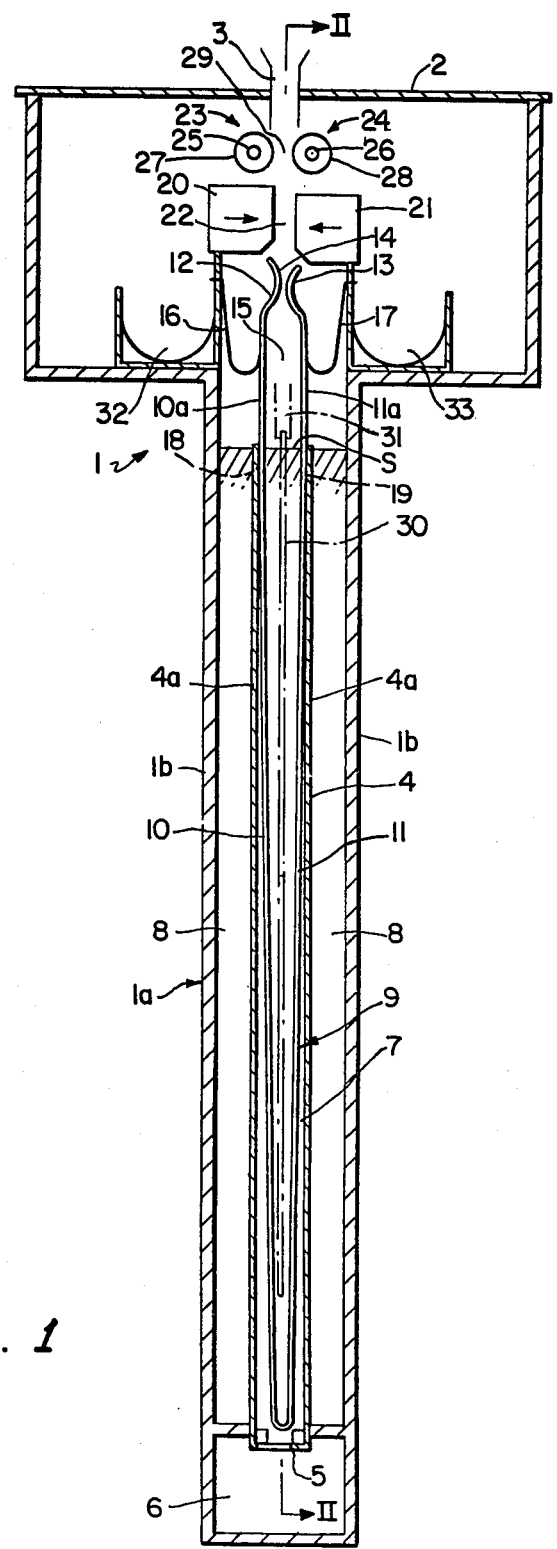
FIG. 1 is a cross-section of a device for the tin-plating of printed circuit boards according to the invention and FIG. 2 is a longitudinal cross-section through the tin-plating device along the line II-II in FIG. 1.

The structure and the mode of operation of the tin-plating device for printed circuit boards now will be described on the basis of the drawings. As employed below, the term "tin-plating" refers not only to a lead-tin alloy, but also to any suitable solder of a different type.

The tin-plating device has a casing indicated by 1 which is closed on the top by a cover 2. In this cover 2, there is a slot-like opening 3 for the printed circuit boards.

A solder bath container 4 is arranged in the lower part 1a of the casing 1 and is open towards the opening 3 and is closed off at the bottom by a perforated bottom 5. The interior of the solder bath container 4 is in connection, through perforated bottom 5, with a distribution chamber 6 which is provided on the bottom of the lower part 1a of the casing. The actual solder bath 7 is in the solder bath container 4. A collecting chamber 8 is formed for the solder between the walls 4a of the solder bath container 4 and the walls 1b of the lower part 1a of the casing. The solder is transported from the distribution chamber 6 upward through the solder bath container 4 by means of a pump which is not shown. The solder flows subsequently into the collecting chamber 8 over the upper edges of the container walls 4a from where it enters again the distribution chamber 6. The heating system required for the heating of the solder which is of an actually known design is not shown. While the pump is not operating, the level S of the solder bath is below the upper edge of the walls 4a of the solder bath container 4, it is shown in the drawings.

Figure 2:
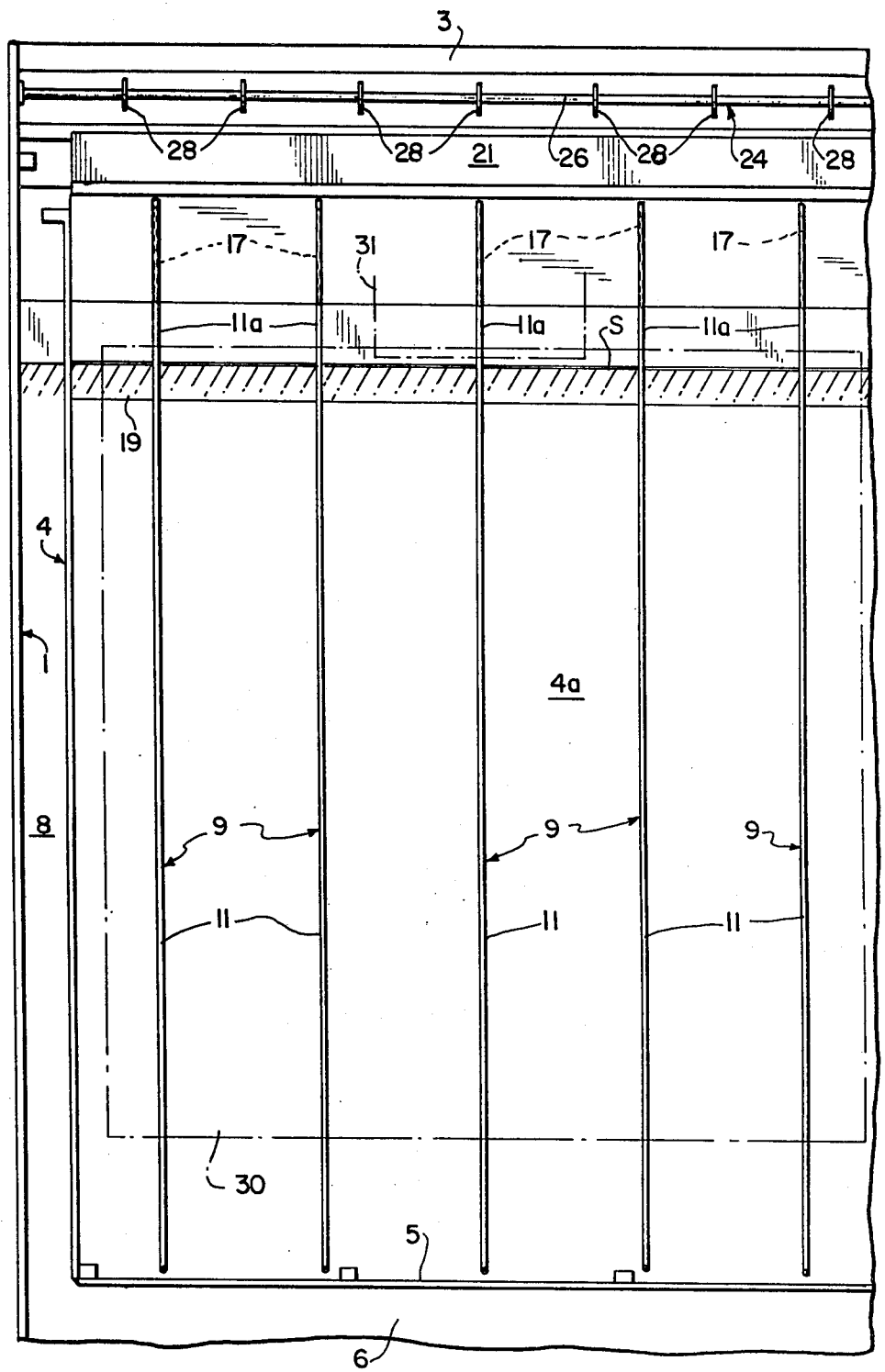

Guides 9 are arranged in the interior of the solder bath container 4 at a distance from each other and distributed across the width of the solder bath container 4, as can be seen from FIG. 2 in which a portion of the casing is not shown at the bottom and on the right side. Each of these guides 9 is formed by two rod-like guide elements 10 and 11 which are spaced opposite each other at a certain distance from each other and which are connected to each other at their lower ends, as can be particularly seen from FIG. 1. The thus clamp-like designed guides 9 extend into the area of the perforated bottom 5 of the solder bath container 4 and project above the solder bath level S. At the end of their upper final section 10a or 11a, respectively, the rod-like guide elements 10, 11 are provided with deflections 12 and 13, respectively. As is shown in FIG. 1, the deflection 12, 13 of each guide element 10, 11 projects toward the opposite guide element 10 or 11, respectively, so that there is provided a narrowing 14 of the space 15 between the two guide elements 10, 11 by means of deflections 12, 13 of the guide elements 10, 11.

The upper final sections 10a, 11a of the guide elements 10 and 11, respectively, projecting upward out of the solder bath 7 can be spring-elastically spread apart and are, for this purpose, supported by stationary support springs 16 and 17, respectively. In the area of the solder bath level S, mounting supports 18 and 19, respectively, are attached to the inner sides of the walls 4a opposite each other of the solder bath container 4 in which the guides 9, i.e. the guide elements 10 and 11, are held. Instead of a single munting support 18 or 19, respectively, for the guide elements 10 or 11, respectively, also a separate mounting support can be provided for each guide element 10 or 11 which is fastened to the container walls 4a. The mounting supports 18, 19 are attached at such a level on the walls 4a that they slightly project above the solder level S when the pump is out of operation so that the seat of the in mounting supports 18, 19 can be inspected time. Two blast nozzles 20 and 21 are arranged above the guides 9 and extend across the entire width of the solder bath container 4 and form between themselves an interspace 22 which is aligned with the narrowing 14. These blast nozzles 20, 21 are connected to a hot air source, such as is described in greater detail, for example, in German Disclosure Publication 24 11 854. Two semi-circular tubs or troughs 32, 33 which extend preferably across the entire width of the solder bath container 4 and in which the excessive solder, as removed by the hot air jets, is caught, are arranged in parallel to the two blast nozzles 20, 21. A worm gear, not shown, is arranged in each of the tubs 32, 33, by means of which the excess solder is discharged laterally from the system before solidifying, preferably in a continuous manner. There are two guide elements 23 and 24 extending in parallel to each other above the two blast nozzles 20, 21 and also extending across the width of the solder bath container 4 parallel to the blast nozzles 20, 21. Each of these guide elements 23, 24 has a carrier rod 25 or 26, respectively, on which guide disks 27 or 28, respectively, are positioned at a distance from each other (see especially FIG. 2). The guide disks 27, 28 can be made so that they are spring-elastically deflectable. The guide elements 23, 24 form between them an opening 29 which is aligned with the opening 3 in the casing cover 2 and the space 22 between the blast nozzles 20, 21.

A printed circuit board 30 is shown by dot-dash lines and is held by a schematically indicated gripping device 31.

The operating method of the described tin-plating device is as follows.

The printed circuit board 30, which is seized in a known manner by the gripping device 31, is introduced into the device through the opening 3 in the casing cover 2 and passes between the two guide elements or members 23 and 24. These guide elements 23, 24 have the task of guiding curved printed circuit boards 30, without damaging them, past between and the blast nozzles 20, 21 to the guides 9. Subsequently, the printed circuit board 30 passes through the narrowing 14 between the guide elements 10, 11, arranged opposite each other, into the space 15 between guide elements 10, 11.

The width of narrowing 14 is somewhat larger than the thickness of the printed circuit board 30 so that the latter, if it is entirely planar, can be passed, without contact, between the deflections 12, 13 of the guide elements 10 and 11. The upper final sections 10a, 11a of the guide elements 10 and 11 are pushed apart by the gripping device 31 and spring back again into their original position owing to their own elasticity and/or under the effect of the support springs 16, 17. When curved boards are introduced, the final sections 10a, 11a can also be spread apart, which permits the introduction even of curved boards without damaging these boards by the guide elements 10, 11.

After having passed the narrowing 14, the printed circuit board 30 enters the space 15 between the guide elements 10, 11 which is considerably larger than the thickness of the printed circuit board 30. The solder is then applied on the printed circuit board 30 in the solder bath 7 in the known manner.

Since, as already mentioned, the guides 9 extend into the area of the perforated bottom 5, even curved boards are held by guides 9 essentially in the center of the solder bath container 4. Guides 9 thus prevent the printed circuit boards 30 from coming into contact with the walls 4a of the solder bath container 4. As is shown in FIG. 1, the guide elements 10 and 11 converge together towards the bottom whereby the space 15 between these guide elements 10, 11 becomes correspondingly narrower. This measure contributes additionally to a proper positioning even of curved printed circuit boards 30 in the center of the solder bath container 4.

After the tin-plating process is terminated, the printed circuit board 30 is pulled out again from the solder bath 7 in the known manner. By doing so, it is moved through the narrowing 14 and between the blast nozzles 20 and 21. During this movement, hot air jets leaving the blast nozzles 20 and 21 act on both sides of the printed circuit board 30. Excess solder is removed by means of these hot air jets and solder in the passage holes in the printed circuit board 30 is removed as described in detail, for example, in German Disclosure Publication 24 11 854. After the excess solder has been removed, the printed circuit board 30 is led out of the device through the opening 29 and the casing opening 3.

Owing to the guide elements 10, 11 on both sides of the printed circuit board 30 being formed in rows being arranged at a certain distance from each other and being distributed across the width of the printed circuit board 30, several guide points are formed which guarantee sufficient guiding and positioning without a constant mechanical contact between the printed circuit board 30 and the guide elements 10, 11. As has already been mentioned, the width of the narrowing 14 is somewhat larger than the thickness of the printed circuit board 30 so that, as a rule, the guide elements 10, 11, i.e. their deflections 12, 13, do not rest on the printed circuit board 30. Since the upper final sections 10a, 11a of the guide elements 10, 11 can be bent out in a spring-elastic manner, these final sections 10a, 11a can elastically turn away if the printed circuit board 30 abuts against deflections 12, 13. The printed circuit board 30 is exactly guided, on the one hand, and damage thereto by the guides 9 is avoided, on the other hand, since these guides 9 do not represent a solid mechanical resistance to the printed circuit board 30.

The distance between the guide elements 10, 11, arranged opposite each other, becomes larger below the narrowing 14. This means that no contact normally takes place below this narrowing 14 between the printed circuit board 30 and the guide elements 10, 11. The printed circuit board 30 thus is freely accessible on all sides in the solder bath 7 and is not covered anywhere by the guides 9.

When pulling out the printed circuit board from the solder bath container 4, the upper final sections 10a, 11a of the guide elements 10, 11 act in a particularly advantageous manner as stabilizing elements which prevent vibration of the printed circuit board by the hot air jets from the blast nozzles 20 and 21, arranged as shown in FIG. 1 to be vertically staggered with respect to each other, which would otherwise cause the printed circuit board, being particularly sensitive in the position, to abut against components of the device and thus would lead to damage to the printed circuit board. For the purpose of the desired stabilization of the respective printed circuit board when it is removed from the device, the upper final sections 10a, 11a of the guide elements 10, 11 project as far as possible into the space 22 between the two blast nozzles 20 and 21 which are somewhat staggered with respect to each other in the vertical direction. Additionally, the upper final sections 10a, 11a of the guide elements 10, 11 are designed to be spring-elastic in directions transverse to the wide sides of the passing printed circuit boards so that the respective printed circuit board is stabilized by these means and damage to the printed circuit board, by abutting against the upper final sections 10a, 11a of the guide elements 10, 11, is avoided. Finally, the width of the gap 14, between the upper final sections 10a, 11a of the guide elements 10, 11 or of the deflections 12, 13, is determined or adjusted for the desired stabilization of the printed circuit board to be removed from the solder bath.

Since the guides 9 act on the front and rear sides of the printed circuit board 30 and the printed circuit board 30 need not, therefore, be guided at its edges, the necessity of an exact lateral positioning is eliminated and printed circuit boards 30 of different widths can be processed without requiring an adjustment of the guides 9.

It goes without saying that the described tin-plating device can be designed differently from what has been shown with regard to various parts. Only a few of the possible variations are mentioned below. The width of the gap between the deflections 12, 13, i.e. the width of the narrowing 14, can be changed by modifying the force which is exerted on the upper final sections 10a, 11a by the support springs 16, 17. This can, for example, be achieved by using support springs 16, 17 with different spring characteristics. If the upper final sections 10a, 11a of the guide elements 10, 11 have the necessary spring-elastic properties, the support springs 16, 17 may be eliminated under certain circumstances.

Owing to the fact that the guide elements 10, 11 positioned opposite each other in pairs and are connected with each other, a particularly advantageous design is obtained from the point of view of production, effect and maintenance. However, it is also possible not to connect the lower ends of the pairs of guide elements 10, 11 arranged opposite each other, at their lower ends. Furthermore, the guide elements 10 can be laterally staggered vis-a-vis the guide elements 11 so that guide elements 10, 11 are no longer directly opposite each other relative to the printed circuit board 30.

I claim:

1. A process for applying solder to a printed circuit board, said process comprising:

vertically downwardly introducing a printed circuit board through an open upper end of a solder bath container containing a solder bath, thereby applying solder to said printed circuit board, and then vertically upwardly withdrawing said printed circuit board from said solder bath through said open upper end of said solder bath container; and guiding said vertically downward and upward movements by loosely contacting only opposite sides of said printed circuit board and without contacting lateral edges thereof by means of a guide system, while simultaneously centering said printed circuit board, in opposite directions transverse to the vertical plane thereof, by means of said guide system.

2. A process as claimed in claim 1, comprising providing said guide system as a plurality of generally vertically extending rod-shaped guide elements extending into said solder bath within said container, and arranging said guide elements in two parallel rows spaced from each other by a distance greater than the thickness of said printed circuit board, with each said row comprising plural said guide elements spaced from each other across the width of said container, and said centering comprises centering said printed circuit board between said two rows of guide elements.

3. A process as claimed in claim 2, further comprising elastically biasing an upper portion of each said guide element in a direction toward the opposite said row of guide elements.

4. A process as claimed in claim 1, further comprising directing gas jets against opposite sides of said printed circuit board during said vertically upward movement thereof, thereby removing excess solder from said printed circuit board.

5. A process as claimed in claim 4, comprising vertically staggering said gas jets on one side of said printed circuit board with respect to said gas jets on the opposite side thereof.

* * * * *